United States Patent
Wu et al.

[11] Patent Number: 6,103,606
[45] Date of Patent: *Aug. 15, 2000

[54] METHOD OF FABRICATING A WORD LINE

[75] Inventors: Der-Yuan Wu, Taipei; Yi-Chung Sheng, Taichung, both of Taiwan

[73] Assignee: United Microelectronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/727,089

[22] Filed: Oct. 7, 1996

[30] Foreign Application Priority Data

Sep. 21, 1996 [TW] Taiwan .................................. 85111565

[51] Int. Cl.[7] ....................... H01L 21/3205; H01L 21/44; H01L 27/108; H01L 23/48

[52] U.S. Cl. ......................... 438/586; 438/592; 438/655; 438/656; 257/296; 257/384; 257/757; 257/770

[58] Field of Search ................................... 438/586, 592, 438/655, 656, 567, 195, 239; 257/296, 755, 757, 770, 384

[56] References Cited

U.S. PATENT DOCUMENTS

| | | | |
|---|---|---|---|
| 4,128,670 | 12/1978 | Gaenssien | 427/86 |
| 4,851,295 | 7/1989 | Brors | 428/450 |
| 4,886,764 | 12/1989 | Miller et al. | 438/592 |
| 4,910,578 | 3/1990 | Okamoto | 357/71 |
| 5,070,038 | 12/1991 | Jin | 437/200 |
| 5,431,770 | 7/1995 | Lee et al. | 156/653.1 |
| 5,441,914 | 8/1995 | Taft et al. | 437/189 |
| 5,472,896 | 12/1995 | Chen et al. | 437/44 |
| 5,500,249 | 3/1996 | Telford et al. | 427/255 |
| 5,604,157 | 2/1997 | Dai et al. | 437/200 |
| 5,635,765 | 6/1997 | Larson | 257/768 |
| 5,643,819 | 7/1997 | Tseng | 437/60 |
| 5,700,731 | 12/1997 | Lin et al. | 438/381 |
| 5,723,893 | 3/1998 | Yu et al. | 257/413 |

FOREIGN PATENT DOCUMENTS

| | | |
|---|---|---|
| 0400821 A2 | 5/1990 | European Pat. Off. . |
| 0497596 A2 | 1/1992 | European Pat. Off. . |
| 63-058943 | 3/1988 | Japan . |
| 63-120419 | 5/1988 | Japan . |
| 63-133672 | 6/1988 | Japan . |
| 1-205468 | 8/1989 | Japan . |
| 2-034967 | 2/1990 | Japan . |
| 2-073669 | 3/1990 | Japan . |

OTHER PUBLICATIONS

IBM Tech. Discl. Bull., vol. 28, No. 9, pp. 3968–3969, Feb. 1986.

Adler et al, IBM Tech. Discl. Bull., vol. 26, No. 5, pp. 2309–2310, Oct. 1983.

Campbell et al, IBM Tech. Discl. Bull., vol. 25, No. 4, pp. 1920–1921. Sep. 1982.

*Primary Examiner*—John F. Niebling
*Assistant Examiner*—Ha Tran Nguyen
*Attorney, Agent, or Firm*—Jiawei Huang; J.C. Patents

[57] ABSTRACT

On a substrate with a number rows of gates are formed. After a metal silicide layer is formed above the gates, a silicon-rich layer is formed. The silicon-rich layer is either a further metal silicide layer, with a higher silicon concentration or a pure silicon layer.

9 Claims, 2 Drawing Sheets

METHOD OF FABRICATING A WORD LINE

BACKGROUND OF THE INVENTION

1. Field of the Invention

The invention relates in general to the fabrication of semiconductor integrated circuits (ICs), and more particularly to the fabrication of a word line in dynamic random access memory circuits.

2. Description of the Related Art

To maximize the surface area of a capacitor for a dynamic random access memory (DRAM), the capacitor is typically formed over word lines. However, because the word lines and the storage cells are both conductive layers, an insulating layer between them is necessary. Silicon oxide and silicon nitride are both widely used as insulating layers. However, using silicon nitride causes a potential stress effect on the associated transistor gate and causes difficulties in patterning the gate as well. Therefore, silicon oxide is the most often used material for this application. Deposition is frequently employed to form a silicon oxide (cap oxide) layer, in particular, low pressure chemical vapor deposition (LPCVD) at 700° C. is preferred because of the resulting efficiency.

The following describes a conventional process for forming a word line used in DRAM fabrication.

Referring to FIG. 1A, a substrate 10 with gate oxide layer 14 and word line 16 is provided. A refractory tungsten silicide ($WSi_2$) layer 18 is then formed on the word line 16, which is a polysilicon material. This approach reduces interconnect resistance. The silicides of interest can be formed by three basic techniques, each of which involves a deposition followed by a thermal step to form the silicide 18:

1) deposition of pure tungsten on the polysilicon layer 16;
2) simultaneous evaporation of silicon and tungsten from two sources (co-evaporation); and
3) sputter-depositing tungsten silicide, either from a composite target, or by co-sputtering or layering.

Referring now to FIG. 1B, an insulating layer 20 must be formed on the surface of the tungsten silicide layer 18 to isolate the tungsten suicide layer 18 from subsequently deposited layers. Vapor deposited silicon oxide and silicon nitride can be used for this application, but a silicon oxide layer 20 formed by LPCVD at 700° C. generally provides better material properties and is therefore preferred. The oxide layer 20 formed must be stable and exhibit adequate electrical and physical properties. However, in practice, the surface of the tungsten silicide layer 18 easily converts to tungsten oxide in the presence of oxygen and at a high temperature, such as, 700° C. Although the tungsten oxide is initially volatile, it unavoidably remains on the top surface of the tungsten silicide layer 18 after the cap oxide layer 20 is deposited due to the efficiency of the deposition process. Therefore, the undesirable tungsten oxide ($WO_3$) layer 22 is unavoidably formed under the silicon oxide layer 20. In other words, the tungsten oxide layer 22 is formed between tungsten silicide layer 18 and the silicon oxide layer 20. Moreover, the tungsten oxide layer 22 is not smooth, having a number of concave and convex areas, which results in the surface of the silicon oxide layer 20 being rough as well. Another effect that can be observed is that the polysilicon layer 16 becomes thicker while, by contrast, the tungsten silicide layer 18 becomes thinner. The above mentioned undesirable effects make patterning of the word line 16 rather difficult.

SUMMARY OF THE INVENTION

It is therefore an object of the invention to provide a process for fabricating a word line to overcome the above mentioned problems.

The invention achieves the above-identified objects by providing a new method of fabricating a word line, which includes forming a plurality rows of gates on a substrate; forming a first metal silicide layer on each row of gates; and either forming another metal silicide layer which is silicon-rich, or forming a silicon layer, instead, on the previously formed metal silicide layer.

BRIEF DESCRIPTION OF THE DRAWINGS

Other objects, features, and advantages of the invention will become apparent from the following detailed description of the preferred but non-limiting embodiments, by reference to the accompanying drawings in which.

DETAILED DESCRIPTION OF THE PREFERRED EMBODIMENT

An exemplary embodiment of the invention will now be described in detail with reference to the accompanying drawings.

Figure 1A:
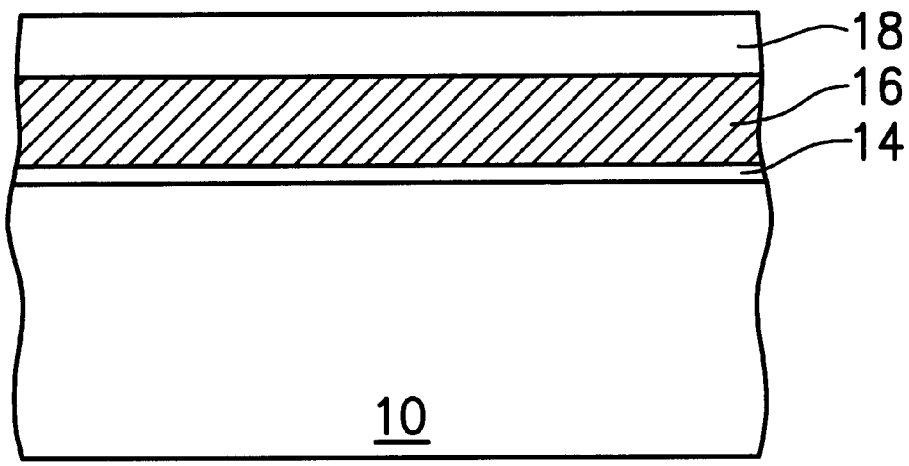
FIGS. 1A and 1B are cross-sectional views showing a conventional (Prior Art) process of fabricating a word line.
Figure 1B:
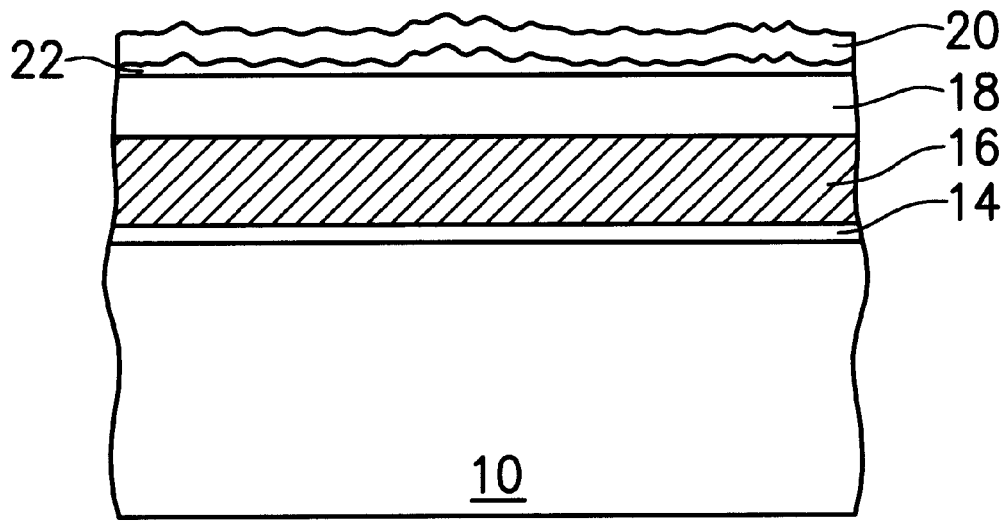
Figure 2A:
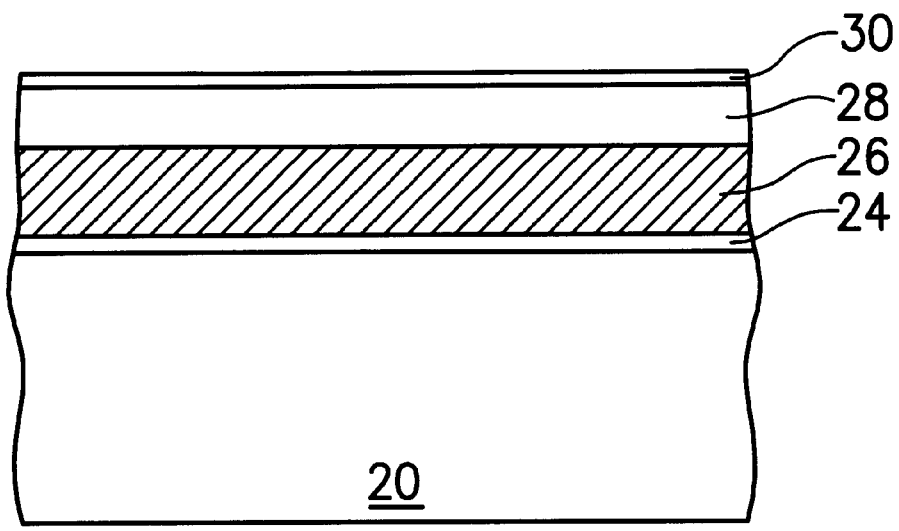
FIGS. 2A to 2B are cross-sectional views showing the process of a preferred embodiment of a method for fabricating a word line according to the invention.

Referring first to FIG. 2A, a substrate 20 with gate oxide layer 24 and a polysilicon word line 26 is provided. A refractory metal silicide layer 28, preferably a tungsten silicide, is then formed on the word line 26. Since the fabrication steps up to this point are known to those skilled in this art, it is unnecessary to describe them in detail. Next, a silicon-rich metal silicide, or even a pure silicon layer, 30 is formed on the top surface of the metal silicide layer 28. Layer 30 thus has a higher concentration of silicon than the layer 28. As shown in FIG. 2A, the layer 30 has a thickness less than that of the metal silicide layer 28. The silicon-rich metal silicide layer 30 is preferably a tungsten silicide layer chemically vapor deposited with the reactants silicon chloride ($SiCl_2H_2$) and tungsten fluoride ($WF_6$). Tungsten fluoride is a corrosive gas, with a relatively high density, and a moderately-high vapor pressure at room temperature. A commercial cold-wall system has been successfully used for tungsten silicide deposition. Silicon chloride and tungsten fluoride can be, for example, in a ratio of 1:1.

Figure 2B:
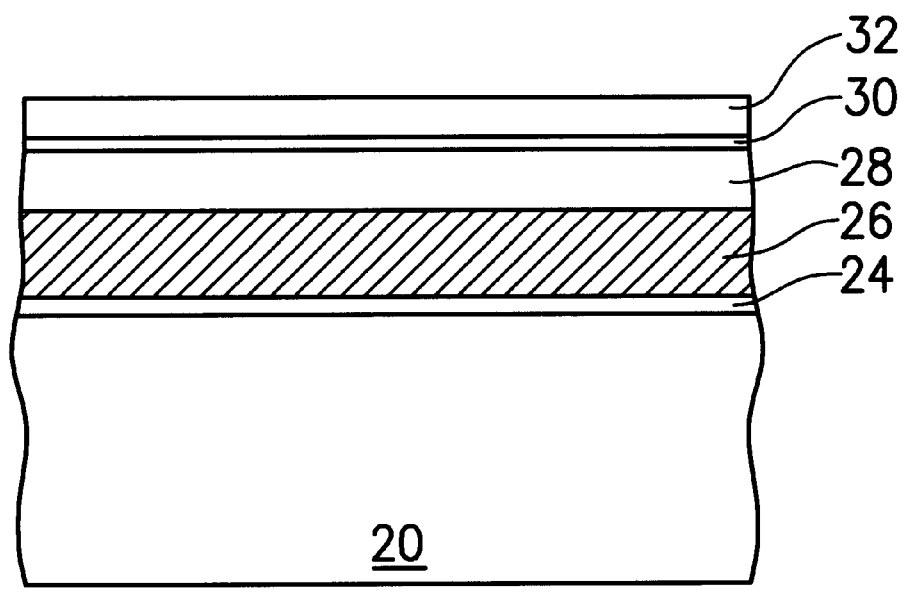

Referring next to FIG. 2B, a cap oxide layer 32 is then formed on the top surface of the silicon-rich tungsten silicide or pure silicon layer 30. With this method, it has been found that there is no disadvantageous formation of tungsten oxide, thereby enabling a less difficult patterning of the word line. Further, the surface of the oxide layer 32 can be kept smooth. Moreover, processing a word line in accordance with the above described preferred embodiment of the invention will not change the thickness of the gate, polysilicon layer 26, or the metal silicide layer 28.

While the invention has been described by way of example and in terms of a preferred embodiment, it is intended that the invention not be limited to one particular embodiment. To the contrary, the invention is intended to cover various modifications, and similar arrangements and procedures. Therefore, the scope of the appended claims should be accorded the broadest interpretation so as to encompass all such modifications, and similar arrangements and procedures.

What is claimed is:

1. A method of fabricating a word line, comprising:

providing a substrate;

forming a polysilicon layer on the substrate;

forming a first tungsten silicide layer on the polysilicon layer;

forming a second tungsten silicide on the first tungsten silicide layer after forming the first tungsten silicide layer, wherein a concentration of silicon of the second tungsten silicide layer is greater than a concentration of silicon of the first tungsten silicide layer; and forming a cap oxide layer on the second tungsten silicide layer; wherein the silicon concentration of the second tungsten silicide layer is so determined that a formation of $WO_3$ at an interface between the second tungsten silicide layer and the cap oxide layer is substantially prevented.

2. A word line of a dynamic random access memory, fabricated according to the method of claim 1.

3. The method according to claim 1, wherein silicon chloride and tungsten are used as reactants in a ratio of 1:1 while performing a chemical vapor deposit of the metal silicide layer.

4. A method of fabricating a word line, comprising:

providing a substrate;

forming a gate on the substrate;

forming a refractory metal silicide layer on the gate; and forming a silicon-rich tungsten silicide layer on the refractory metal silicide layer after forming the refractory metal silicide layer, wherein a silicon concentration of silicon-rich tungsten silicide layer is greater than a silicon concentration of the refractory metal silicide layer and the silicon-rich tungsten silicide layer is thinner than the refractory metal suicide layer; and forming a cap oxide layer on the silicon-rich tungsten silicide layer; wherein the silicon concentration of the silicon-rich tungsten silicide layer is so determined that a formation of $WO_3$ at an interface between the silicon-rich tungsten silicide layer and the cap oxide layer is substantially prevented.

5. A word line of a dynamic random access memory, fabricated according to the method of claim 4.

6. The method according to claim 4, further comprising forming a cap oxide layer above the silicon-rich metal silicide layer.

7. The method according to claim 4, wherein the step of forming a silicon-rich metal silicide layer on the refractory metal silicide layer is performed using silicon chloride and tungsten fluoride as reactants.

8. The method according to claim 7, wherein the silicon chloride and the tungsten fluoride are present as reactants in a ratio of 1:1.

9. The method according to claim 4, wherein the step of forming a silicon-rich metal silicon layer on the refractory metal suicide layer is performed by chemical vapor deposition.

* * * * *